(12) United States Patent
Akram

(10) Patent No.: US 6,365,952 B1
(45) Date of Patent: *Apr. 2, 2002

(54) TRENCH ISOLATION FOR CMOS DEVICES

(75) Inventor: Salman Akram, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/140,999

(22) Filed: Aug. 26, 1998

Related U.S. Application Data

(62) Division of application No. 08/918,566, filed on Aug. 22, 1997.

(51) Int. Cl.[7] .............................................. H01L 21/762
(52) U.S. Cl. ........................ 257/510; 438/427; 438/435
(58) Field of Search ................................ 257/374, 397, 257/510–513, 520–521, 647, 506; 438/221–222, 296, 359–361, 424, 429–430, 432, 425, 437, 439, 444, 427, 435

(56) References Cited

U.S. PATENT DOCUMENTS

| | | | | |
|---|---|---|---|---|
| 4,156,939 A | * | 5/1979 | Takemae et al. ............. 257/296 |
| 4,472,240 A | | 9/1984 | Kameyama ................. 438/427 |
| 4,495,025 A | * | 1/1985 | Haskell ....................... 438/427 |
| 4,579,812 A | | 4/1986 | Bower ......................... 430/313 |
| 5,013,680 A | | 5/1991 | Lowrey et al. .............. 438/242 |
| 5,047,117 A | | 9/1991 | Roberts ....................... 438/424 |
| 5,057,450 A | * | 10/1991 | Bronner et al. ............. 438/424 |
| 5,097,381 A | | 3/1992 | Vo et al. ..................... 361/313 |
| 5,122,848 A | | 6/1992 | Lee et al. .................... 257/265 |
| 5,177,028 A | | 1/1993 | Manning ..................... 438/289 |
| 5,208,177 A | | 5/1993 | Lee ............................. 438/239 |
| 5,229,316 A | | 7/1993 | Lee et al. .................... 438/424 |
| 5,241,496 A | | 8/1993 | Lowrey et al. ............... 365/96 |
| 5,250,450 A | | 10/1993 | Lee et al. .................... 438/270 |
| 5,275,965 A | | 1/1994 | Manning ..................... 438/430 |
| 5,292,683 A | | 3/1994 | Dennison et al. ........... 438/296 |
| 5,346,584 A | | 9/1994 | Nasr et al. ................... 438/427 |
| 5,358,884 A | | 10/1994 | Violette ....................... 438/361 |
| 5,358,894 A | | 10/1994 | Fazan et al. ................. 438/440 |
| 5,376,817 A | | 12/1994 | Seyyedy et al. ............. 257/374 |
| 5,387,534 A | | 2/1995 | Prall ............................ 438/287 |
| 5,393,683 A | | 2/1995 | Mathews et al. ........... 438/762 |
| 5,397,908 A | | 3/1995 | Dennison et al. ........... 257/306 |
| 5,416,348 A | | 5/1995 | Jeng ............................ 257/297 |
| 5,420,061 A | | 5/1995 | Manning ..................... 438/218 |
| 5,424,569 A | | 6/1995 | Prall ............................ 257/324 |

(List continued on next page.)

FOREIGN PATENT DOCUMENTS

JP   54-128298   * 10/1979  ................. 257/397

OTHER PUBLICATIONS

A. S. Tanenbaum, "Structured Computer Organization," 1990, pp. 109–116.*

Primary Examiner—Olik Chaudhuri
Assistant Examiner—Anh Duy Mai
(74) Attorney, Agent, or Firm—Schwegman, Lundberg, Woessner & Kluth, P.A.

(57) ABSTRACT

The present invention is an isolation trench with an insulator, and a method of forming the same using self-aligned processing techniques. The method is implemented with a single mask. A shallow trench is first formed with the mask. Subsequently, the deep trench is formed in self-alignment to the shallow trench. The shallow and deep trenches are filled with insulators. The deep trench diminishes the effects of undesirable inter-device affects, such as leakage current and latch-up. As a result, substrates can be fabricated with high device density.

30 Claims, 6 Drawing Sheets

U.S. PATENT DOCUMENTS

| | | | |
|---|---|---|---|
| 5,433,794 A | 7/1995 | Fazan et al. | 148/33.3 |
| 5,438,016 A | 8/1995 | Figura et al. | 438/444 |
| 5,492,853 A | 2/1996 | Jeng et al. | 438/666 |
| 5,498,566 A * | 3/1996 | Lee | 438/427 |
| 5,508,215 A | 4/1996 | Jeng | 438/244 |
| 5,536,675 A * | 7/1996 | Bohr | 438/427 |
| 5,573,837 A | 11/1996 | Roberts et al. | 428/210 |
| 5,596,213 A | 1/1997 | Lee | 257/316 |
| 5,629,230 A | 5/1997 | Fazan et al. | 438/446 |
| 5,696,022 A * | 12/1997 | Jang | |
| 6,020,230 A * | 2/2000 | Wu | 438/424 |

\* cited by examiner

TRENCH ISOLATION FOR CMOS DEVICES

This application is a Div of Ser. No. 08/918,566 filed Aug. 22, 1997.

FIELD OF THE INVENTION

The present invention relates generally to isolating devices on an integrated circuit, and more specifically to isolating the devices with isolation trenches.

BACKGROUND OF THE INVENTION

Integrated circuits are often fabricated with multiple devices, such as transistors. To minimize integrated circuit size, and hence integrated circuit cost, these devices are often positioned in close proximity to one another. As a result, undesirable inter-device effects can arise. For example, undesired current can leak between devices. Alternatively, a device such as a transistor can switch on as a result of positive feedback between proximate devices. This effect is known as latch-up. Leakage current and latch-up are understood by persons skilled in the art.

To diminish these unwanted inter-device effects, it is desirable to adequately isolate proximate devices. Conventionally, inter-device isolation is accomplished by creating a field oxide between the devices. The field oxide is an electrical insulator. Thus, proximate devices are substantially electrically isolated if the field oxide has adequate dimensions including height, length, and width. However, if the field oxide dimensions are too small, leakage current and latch-up may result.

For example, the undesired inter-device effects may arise if a parasitic metal-oxide-semiconductor field effect transistor (MOSFET) is created between two adjacent devices. FIG. 1 illustrates one embodiment of a parasitic MOSFET 10 on an integrated circuit formed by a conductor 12, active areas 14, and a field oxide 16. The integrated circuit may be a memory, which contains memory cells and complementary MOSFETS. The active areas may be the source and the drain of memory cells or MOSFETs. The conductor 12 may be a wordline of the flash memory. The design and operation of flash memory are known by persons skilled in the art.

The structure of the parasitic MOSFET 10 is now described. The parasitic MOSFET 10 is unintentionally formed by elements of surrounding devices. The conductor 12 and the field oxide 16 function as a gate of the parasitic MOSFET 10. The active areas 14 serve as the source and drain of the parasitic MOSFET 10. Although it is not constructed like a conventional transistor, the parasitic MOSFET 10, nevertheless, may function like one if the field oxide 16 has sufficiently small dimensions. As a result, operation of the parasitic MOSFET 10 may cause undesirable leakage current and latch-up in surrounding devices. Therefore, it is necessary to maintain adequate field oxide 16 dimensions.

Methods of improving device isolation by enhancing field oxide 16 dimensions have been previously disclosed. U.S. Pat. Nos. 5,358,894 and 5,438,016 teach processes for reducing the thinning of the field oxide 16 thickness by respectively applying an impurity and using protective structures. However, these patents do not recite methods or structures that increase the depth that the field oxide 16 penetrates the substrate 18, while keeping the lateral encroachment to a minimum to maximize the area available for device fabrication. Many of these approaches also require multiple masking steps which increase processing costs. A process that minimizes the number of processing steps or masking steps is highly desirable.

In ULSI, devices will be positioned in closer proximity to one another than is done in very large scale integrated circuits (VLSI). However, with current technology, the field oxide 16 may be insufficiently deep, or in other words, does not penetrate sufficiently far into the substrate 18, to isolate the devices. Thus, undesirable leakage current and latch-up may occur in the devices. Therefore, a process and structure for isolating high density devices is necessary.

Furthermore, integrated circuits are fabricated with devices having microscopic, such as sub-micron, features that can only be manufactured with critical processing steps. The critical processing steps entail carefully aligning the substrate 18 to equipment used to build the devices. This requires that most processes leave the substrate 18 in a relatively planar configuration. Therefore, an integrated circuit fabrication process that is less sensitive to process variations is desirable. Such a process would permit successful fabrication of integrated circuits, despite minor misalignments.

SUMMARY OF THE INVENTION

In accordance with the present invention, there is provided an isolation trench in an integrated circuit, and a method of forming the same using self-aligned processing techniques. The isolation trench is created by first forming a shallow trench defined by a mask. The shallow trench is filled with an insulator, such as an oxide. Then some of the insulator is removed. Next, a deep trench is formed in self alignment between the remaining insulator.

In one embodiment, a second oxide is then formed on the integrated circuit. The second oxide is later removed from the shallow trench. Polysilicon is then deposited in the shallow trench. The polysilicon is oxidized and annealed to form field oxide. As a result, the present invention, particularly the deep trench, facilitates enhanced inter-device isolation in high density integrated circuits. Hence, unwanted inter-device effects, such as leakage current and latch-up, are diminished while creating minimal variations in topography. This is desirable for device processing.

In another embodiment, nitride is formed on the walls of the shallow trench. As a result, the field oxide will not significantly encroach neighboring active areas. Reduced encroachment increases the amount of area available for fabrication of devices.

It is also a feature of the present invention that the field oxide may be formed on the integrated circuit with a flat topography without using planarization techniques, such as chemical-mechanical processing or resist etchback. Furthermore, it is an advantage of the present invention that ion implantation is not required to provide inter-device isolation.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawings in which the reference number first appears.

DETAILED DESCRIPTION OF THE EMBODIMENTS

In the following detailed description of the preferred embodiments, reference is made to the accompanying drawings which form a part hereof, and in which is shown by way of illustration specific preferred embodiments in which the inventions may be practiced. These embodiments are described in sufficient detail to enable persons skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
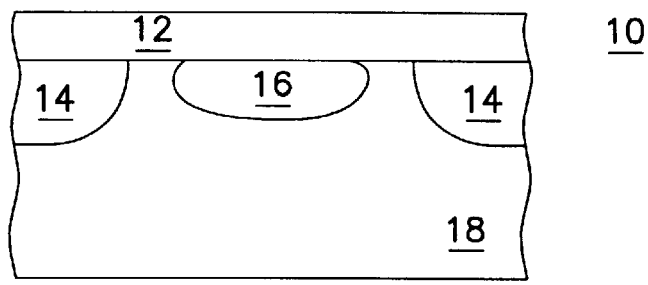
FIG. 1 is a cross-sectional view of one embodiment of a parasitic metal-oxide-semiconductor field effect transistor.
Figure 2:
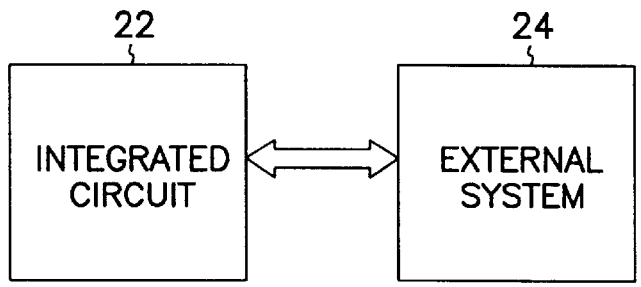
FIG. 2 is a block diagram of one embodiment of an integrated circuit coupled to an external system.

The present invention is directed towards a trench for enhanced inter-device isolation in an integrated circuit, and a method for fabricating the same. The isolation trench is formed by a shallow trench and a deep trench. This goal is achieved by using self-aligned processing techniques which reduce process sensitivity and the number of masks used to fabricate the integrated circuit. In one embodiment, the present invention is used to fabricate an integrated circuit. The integrated circuit 22 may be coupled to an external system 24 as illustrated in FIG. 2. The integrated circuit 22 and the external system 24 may be, respectively, memory and a microprocessor which, for example, form a computer. Alternatively, the external system 24 may be a microcomputer, cellular telephone, or another form of electronic equipment. Also, the integrated circuit 22 may be a communications transceiver.

Figure 3:
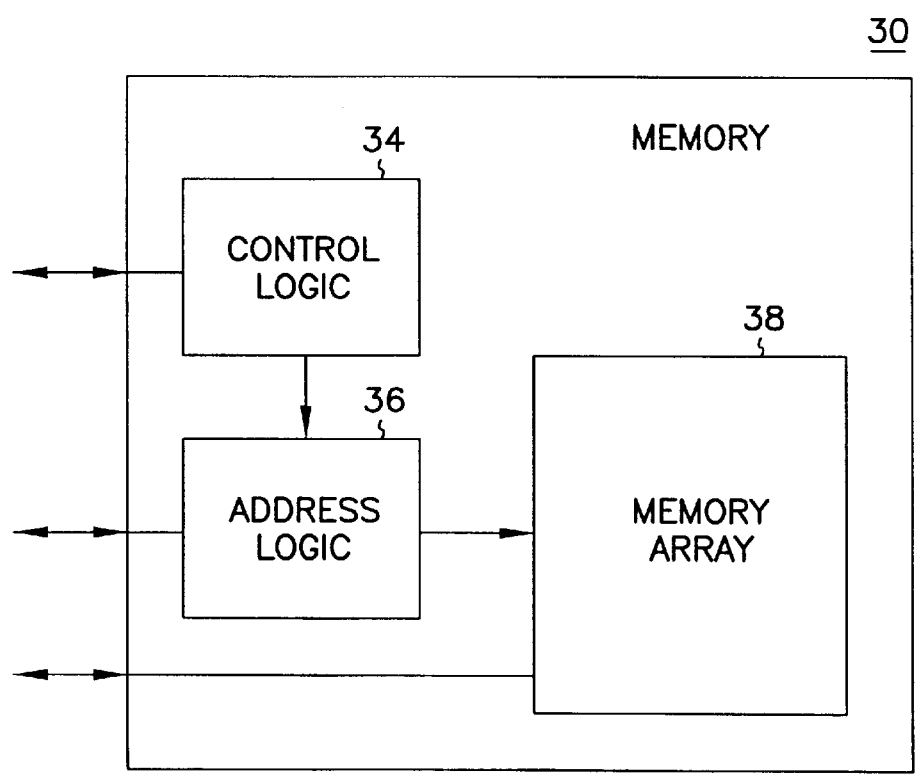
FIG. 3 is a block diagram of one embodiment of a memory.
Figure 4A:
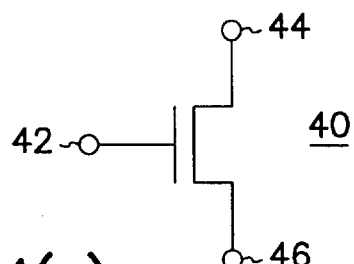
FIG. 4(a) is a schematic diagram of one embodiment of a metal-oxide-semiconductor field effect transistor.
Figure 5:
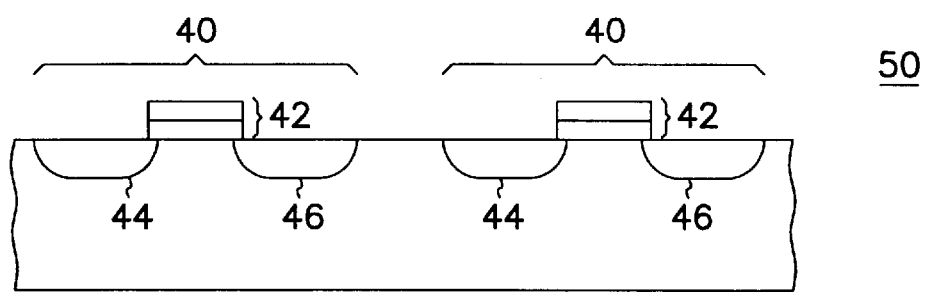
FIG. 5 is a cross-sectional view of one embodiment of an integrated circuit having two adjacent metal-oxide-semiconductor field effect transistors.

As stated above, the integrated circuit 22 may be a memory. FIG. 3 illustrates one embodiment of a memory 30. The memory includes a memory array 38, control logic 34, and address logic 36. The address logic 36 receives an address from the external system 24. The control logic 34 receives external commands to store and/or retrieve data to or from the memory array 38 at cell location(s) provided to the address logic 36 by the external system 24. Subsequently, the data associated with the cell location(s) is respectively transmitted to or received from the external system 24. The memory 30 may be implemented with metal-oxide-semiconductor field effect transistors (MOSFETs) 40, as shown in FIG. 4(a). A MOSFET 40 includes a gate 42, a drain 44, and a source 46. MOSFETs 40 are often formed in close proximity to one another as illustrated in FIG. 5.

Figure 4B:
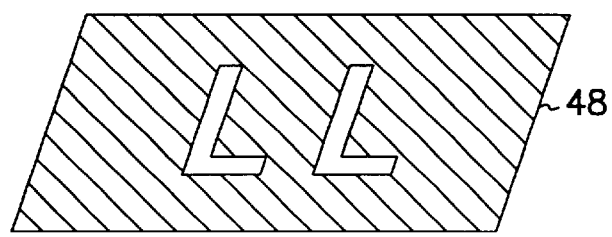
FIG. 4(b) is a view of one embodiment of a mask.

The present invention is used to fabricate an integrated circuit 22, such as a memory 30, with a variety of materials and processing steps. The materials and processing steps are known to persons skilled in the art. The following process steps are typically accomplished with only one mask. An exemplary mask 48 is shown in FIG. 4(b).

Figure 6:
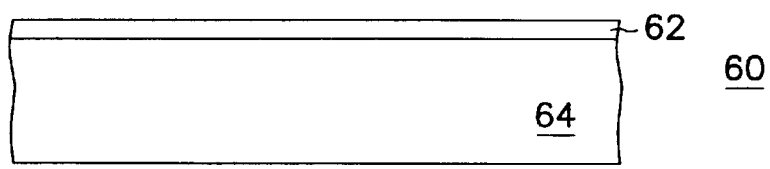
FIG. 6 is a cross-sectional view of one embodiment of an integrated circuit after the formation of a first insulator on a base layer.

Integrated circuit 22 fabrication may be commenced with the formation of a first insulator 62 on a base layer 64, such as a substrate, (step 60) as shown in FIG. 6. The first insulator 62 may be nitride, such as silicon nitride. The base layer 64 may be a semiconductor, such as silicon. The use of the first insulator 62 is optional in the present invention.

Figure 7A:
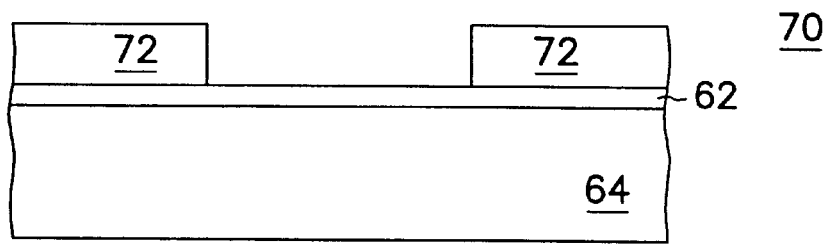
FIG. 7(a) is a cross-sectional view of one embodiment of an integrated circuit after patterning masking layer.
Figure 7B:
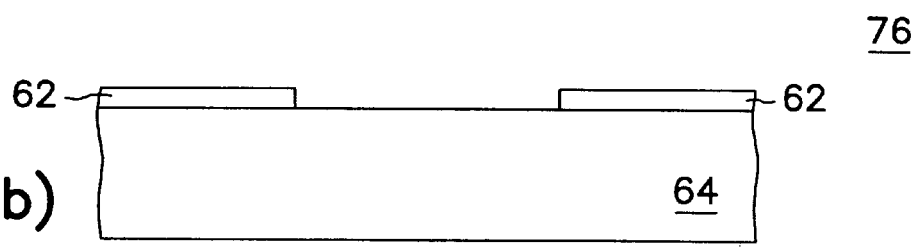
FIG. 7(b) is a cross-sectional view of one embodiment of an integrated circuit after patterning the first insulator.

Next, a cross-section of a shallow trench is defined. The cross-section can be defined by patterning a masking layer 72, such as resist, on the first insulator 62 (step 70), as shown in FIG. 7(a). Also, the cross-section can be defined by patterning the first insulator 62 (step 76), as shown in FIG. 7(b), with conventional masking and removal techniques.

Figure 7C:
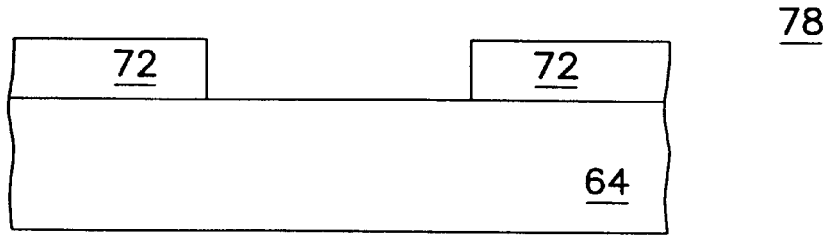
FIG. 7(c) is a cross-sectional view of a second embodiment of an integrated circuit after patterning masking.

Alternatively, as discussed above, the first insulator 62 may not be formed on the base layer 64. Thus, the cross section can be defined by patterning the masking layer 72 directly on the base layer 64 (step 78), as shown in FIG. 7(c).

Figure 8:
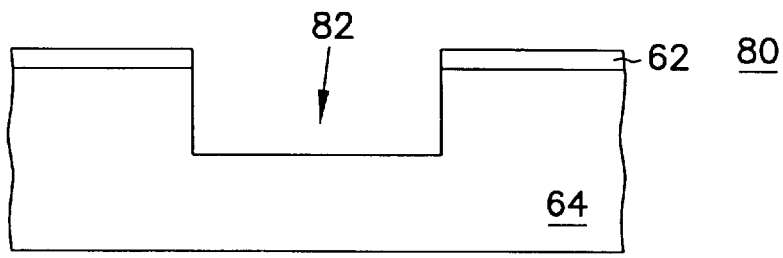
FIG. 8 is a cross-sectional view of one embodiment of an integrated circuit after forming a shallow trench and removing the masking layer.

Next, as illustrated in FIG. 8, a first portion of the integrated circuit 22 is removed to form a shallow trench 82 (step 80). The masking layer 72 is then subsequently removed. The first portion may comprise the uncovered base layer 64. Additionally, the first portion may include the first insulator 62 if a masking layer is patterned on the first insulator 62 (step 70).

Removal in this step and other succeeding steps is performed by etching, such as wet or dry etching, which is known to persons skilled in the art. If the first insulator 62 is patterned (step 76), then the removal step is preferably implemented with a selective etch that does not significantly remove the first insulator 62.

Figure 9:
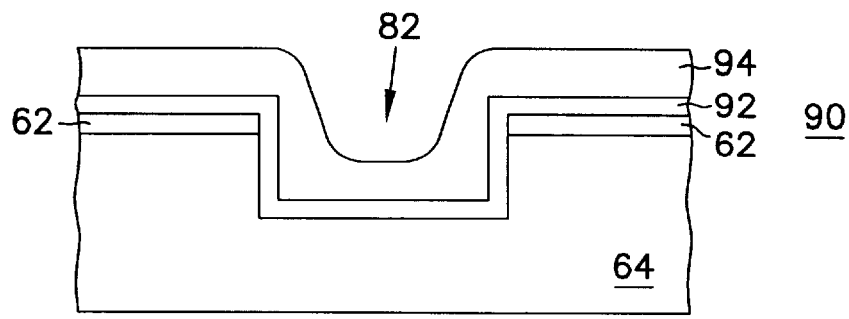
FIG. 9 is a cross-sectional view of one embodiment of an integrated circuit after forming second and third insulators.

FIG. 8 is illustrative of one embodiment of shallow trench 82 formation when the first insulator 62 is formed on the base layer 64. The remaining figures also include the optional first insulator 62 for illustrative purposes. Subsequently, as shown in FIG. 9, a second insulator 92 and then a third insulator 94 are formed on the integrated circuit 22 (step 90). The second insulator 92 may be a nitride, such as silicon nitride. The second insulator 92 diminishes the encroachment by field oxide into a neighboring active area 14 in the base layer 64. The use of the second insulator 92 is optional in the present invention. The remaining figures also include the optional second insulator 92 for illustrative purposes. The third insulator 94 may be an oxide, such as silicon dioxide. However, the third insulator 94 can also be polysilicon if desired.

Figure 10:
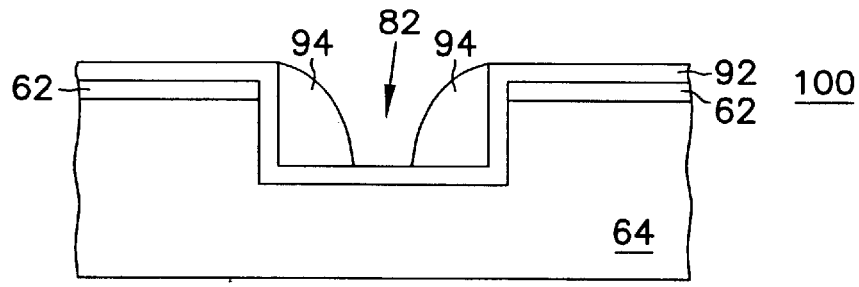
FIG. 10 is a cross-sectional view of one embodiment of an integrated circuit after removing some third insulator.
Figure 11:
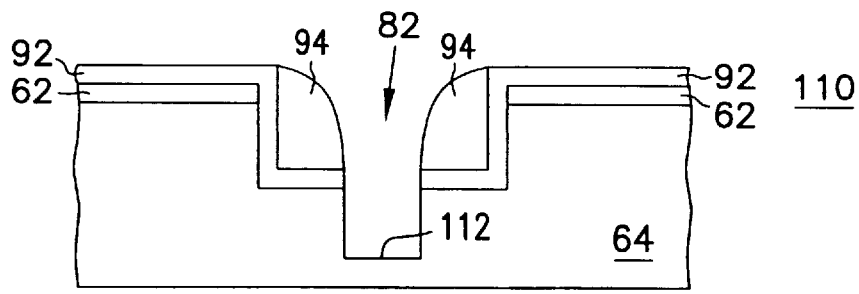
FIG. 11 is a cross-sectional view of one embodiment of the integrated circuit after forming a deep trench.

Next, as shown in FIG. 10, some third insulator 94 is removed, or faceted, such as by etching (step 100) to define a deep trench. The remaining third insulator 94 in the shallow trench 82 permits the deep trench 112 to be formed by removing a second portion of the integrated circuit 22 in self alignment with the shallow trench 82 (step 110), as shown in FIG. 11. Thus, a second mask is not required to create the isolation trench. The deep trench 112 may be formed in the center of the shallow trench 82. A portion of the base layer 64 and second insulator 92 may be removed to form the shallow trench 82 (step 110).

Figure 12:
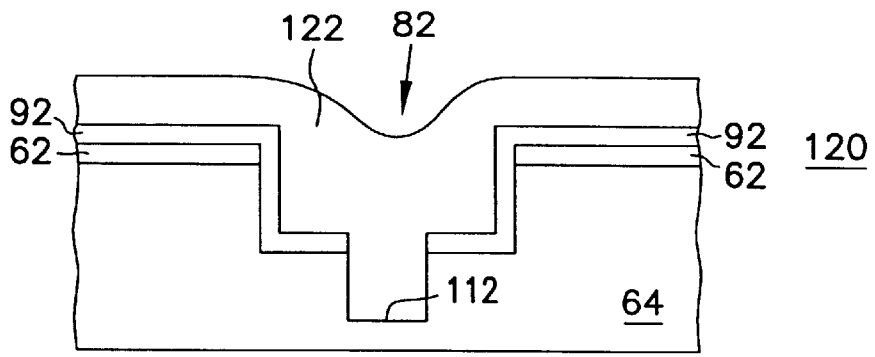
FIG. 12 is a cross-sectional view of one embodiment of the integrated circuit after forming a fourth insulator.
Figure 13:
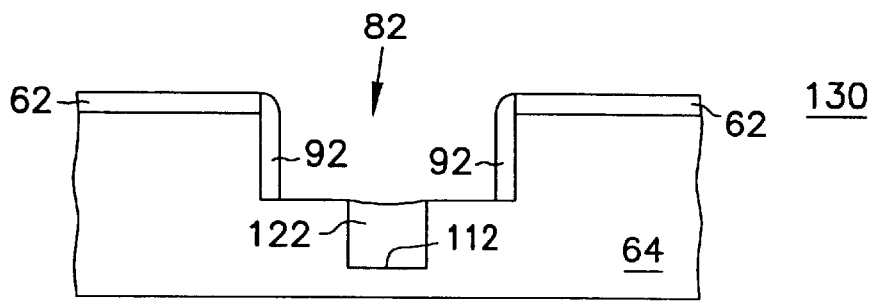
FIG. 13 is a cross-sectional view of one embodiment of the integrated circuit after removing some second and fourth insulator.

A fourth insulator 122 is then formed on the integrated circuit 22 (step 120), as shown in FIG. 12. The fourth insulator 122 may be an oxide such as silicon dioxide. The fourth insulator 122 may include some third insulator 94. Next, as illustrated in FIG. 13, some fourth insulator 122 and then some second insulator 92 may be removed, such as by etching, from the shallow trench 82 (step 130). The portion of the second insulator 92 that is removed is located at the bottom surface of the shallow trench 82 and adjacent to the deep trench 112 (step 130). Thus, the second insulator 92 may only remain on the sidewalls of the shallow trench 82.

Figure 14:
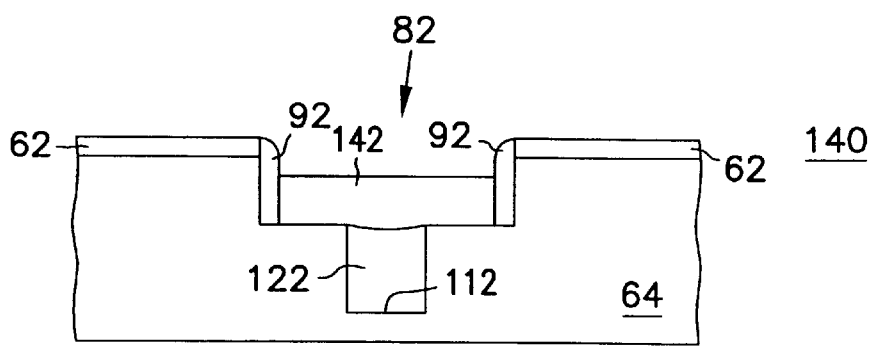
FIG. 14 is a cross-sectional view of one embodiment of the integrated circuit after filling a shallow trench with a semiconductor.
Figure 15:
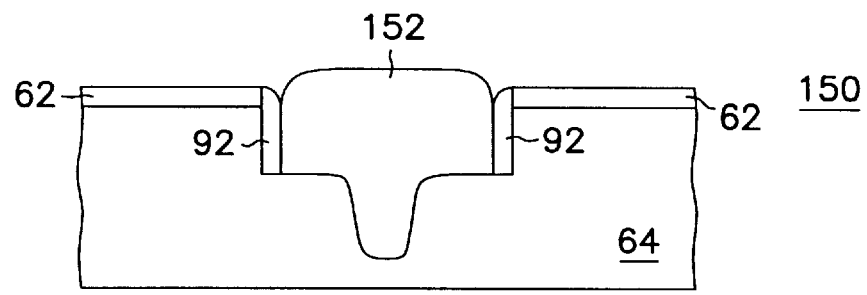
FIG. 15 is a cross-sectional view of one embodiment of the integrated circuit after oxidizing the semiconductor.

Next, as shown in FIG. 14, a semiconductor 142, such as polysilicon, is formed in the shallow trench 82 (step 140). The semiconductor 142 may contact the bottom surface of the shallow trench 82. The semiconductor 142 can partially or completely fill the shallow trench 82. The semiconductor 142 is then oxidized and converted to a fifth insulator 152, such as oxidized polysilicon, (step 150) as shown in FIG. 15(a). During oxidation (step 150), the fifth insulator 152 may also be annealed to improve its isolation properties. After oxidation (step 150), the first and second insulators 62, 92 on the exposed base layer 64 surface can be optionally removed.

Figure 16:
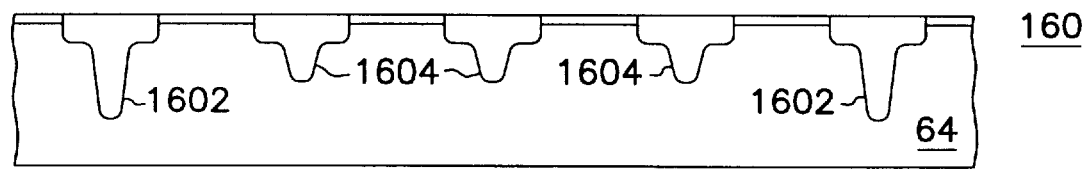
FIG. 16 is a cross-sectional view of one embodiment of the integrated circuit having deep and shallow isolation trenches.

The present invention may be incorporated with conventional isolation techniques, such as local oxidation of silicon (LOCOS), which may form shallower trenches. Furthermore, the present invention can be used to implement trenches of varying depths 1602, 1604, as shown in FIG. 16 (step 160).

Fabrication of the integrated circuit 22 is completed with conventional process steps. These conventional process steps are known by persons skilled in the art.

CONCLUSION

Although specific embodiments have been illustrated and described herein, it will be appreciated by those of ordinary skill in the art that any arrangement which is calculated to achieve the same purpose may be substituted for the specific embodiments shown. This patent is intended to cover any adaptations or variations of the present invention. Therefore, it is manifestly intended that this invention be limited only by the claims and the equivalents thereof.

I claim:
1. A substrate, comprising:
a base layer;
a shallow trench in the base layer;
a nitride layer covering the sidewalls of the shallow trench in direct contact with the base layer of the substrate;
a deep trench in the shallow trench and the base layer; and
wherein the shallow and deep trenches contain oxidized polysilicon.
2. The substrate of claim 1, wherein the deep trench is centered about the shallow trench.
3. The substrate of claim 1, further comprising a second nitride layer of the substrate.
4. A memory, comprising:
a memory array;
control logic;
address logic operatively coupled to the memory array and the control logic; and
wherein the memory further comprises,
a base layer;
a shallow trench, having sidewalls, in the base layer;
a first nitride layer covering the sidewalls in direct contact with the base layer of the substrate;
a second nitride layer covering the base layer;
a deep trench in the shallow trench and the base layer; and
wherein the shallow and deep trenches contain oxidized polysilicon.
5. The memory of claim 4, wherein the deep trench is formed in the center of the shallow trench.
6. A computer system, comprising:
a memory;
a processor coupled to the memory: and
wherein the memory further comprises,
a base layer;
a shallow trench, having sidewalls, in the base layer;
a first nitride layer covering the sidewalls in direct contact with the base layer of the substrate;
a second nitride layer covering the base layer;
a deep trench in the shallow trench and the base layer; and
wherein the shallow and deep trenches contain oxidized polysilicon.
7. The memory system of claim 6, wherein the deep trench is formed in the center of the shallow trench.
8. An integrated circuit memory device, comprising:
all array of memory cells;
a plurality of transistors coupled to the array of memory cells; and
an isolation region interposed between at least two devices, wherein the at least two devices are each selected from the group consisting of a memory cell of the array of memory cells and a transistor of the plurality of transistors, further wherein the isolation region comprises:
a first trench having a width W1, wherein the first trench has a bottom surface D1 distance below a top surface of a base layer;
a second trench downwardly extending from the first trench and substantially aligned with a center of the first trench, wherein the second trench has a width W2 that is less than width W1, further wherein the second trench has a bottom surface D2 distance below the bottom surface of the first trench;

oxidized polysilicon located in at least the first trench; and a layer of nitride in direct contact with the base layer and covering at least the side walls of the first trench.

9. An apparatus, comprising:

a processor; and a memory device coupled to the processor, wherein the memory device comprises:
an array of memory cells
a plurality of transistors coupled to the array of memory cells; and
an isolation region interposed between at least two devices, wherein the at least two devices are each selected from the group consisting of a memory cell of the array of memory cells and a transistor of the plurality of transistors, further wherein the isolation region comprises:
a first trench having a width W1, wherein the first trench has a bottom surface D1 distance below a top surface of the base layer;
a second trench downwardly extending from the first trench and substantially aligned with a center of the first trench, wherein the second trench has a width W2 that is less than width W1, further wherein the second trench has a bottom surface D2 distance below the bottom surface of the first trench;
oxidized polysilicon located in at least the first trench; and
a layer of nitride in direct contact with the base layer and covering at least the side walls of the first trench.

10. An integrated circuit isolation region, comprising:

a base layer having a surface;

a first trench in the base layer, wherein the first trench is defined by the surface of the base layer, first sidewalls extending downward from the surface of the base layer, and a first bottom surface coupled between the first sidewalls;

a second trench in the base layer, wherein the second trench is defined by the first bottom surface, second sidewalls extending downward from the first bottom surface, and a second bottom surface coupled between the second sidewalls;

a first insulator formed in the second trench; and a second insulator formed in the first trench, the second insulator comprising a layer of nitride in direct contact with the base layer and covering at least the side walls of the first trench, wherein the first insulator comprises a material which is different from the second insulator.

11. The integrated circuit isolation region of claim 10, wherein the second insulator is oxidized polysilicon.

12. An integrated circuit isolation region, comprising:

a base layer having a surface;

a first trench in the base layer, wherein the first trench is defined by the surface of the base layer, first sidewalls extending downward from the surface of the base layer, and a first bottom surface coupled between the first sidewalls;

a second trench in the base layer, wherein the second trench is defined by the first bottom surface, second sidewalls extending downward from the first bottom surface, and a second bottom surface coupled between the second sidewalls;

a silicon dioxide layer formed in the second trench;

a layer of nitride in direct contact with the base layer and covering at least the side walls of the first trench; and a layer of oxidized polysilicon formed in the first trench.

13. An integrated circuit isolation region, comprising:

a base layer having a surface;

a first trench in the base layer, wherein the first trench is defined by the surface of the base layer, first sidewalls extending downward from the surface of the base layer, and a first bottom surface coupled between the first sidewall;

a second trench in the base layer, wherein the second trench is defined by the first bottom surface, second sidewalls extending downward from the first bottom surface, and a second bottom surface coupled between the second sidewalls;

a first insulator comprising a layer of nitride formed on the first sidewalls in direct contact with the base layer;

a second insulator formed in the second trench; and a third insulator formed in the first trench, wherein the third insulator comprises a material which is different from the second insulator.

14. The integrated circuit isolation region of claim 13, wherein the first insulator is silicon nitride.

15. The integrated circuit isolation region of claim 13, wherein the third insulator is oxidized polysilicon.

16. An integrated circuit isolation region, comprising:

a base layer having a surface;

a first trench in the base layer, wherein the first trench is defined by the surface of the base layer, first sidewalls extending downward from the surface of the base layer, and a first bottom surface coupled between the first sidewalls;

a second trench in the base layer, wherein the second trench is defined by the first bottom surface, second sidewalls extending downward from the first bottom surface, and a second bottom surface coupled between the second sidewalls;

a nitride layer formed on the first sidewalls in direct contact with the base layer;

a silicon dioxide layer formed in the second trench; and a layer of oxidized polysilicon formed in the first trench.

17. An integrated circuit memory device, comprising:

an array of memory cells a plurality of transistors coupled to the array of memory cells; and an isolation region interposed between at least two devices, wherein the at least two devices are each selected from the group consisting of a memory cell of the array of memory cells and a transistor of the plurality of transistors, further wherein the isolation region comprises:
a base layer having a surface;
a first trench in the base layer, wherein the first trench is defined by the surface of the base layer, first sidewalls extending downward from the surface of the base layer, and a first bottom surface coupled between the first sidewalls;
a second trench in the base layer, wherein the second trench is defined by the first bottom surface, second sidewalls extending downward from the first bottom surface, and a second bottom surface coupled between the second sidewalls;
a first insulator formed in the second trench, and
a second insulator formed in the first trench comprising a layer of nitride in direct contact with the base layer and covering at least the side walls of the first trench, wherein the first insulator comprises a material which is different from the second insulator.

18. The integrated circuit memory device of claim 17, wherein the second insulator is oxidized polysilicon.

19. An integrated circuit memory device, comprising:
an array of memory cells
a plurality of transistors coupled to the array of memory cells; and
an isolation region interposed between at least two devices, wherein the at least two devices are each selected from the group consisting of a memory cell of the array of memory cells and a transistor of the plurality of transistors, further wherein the isolation region comprises:
a base layer having a surface;
a first trench in the base layer, wherein the first trench is defined by the surface of the base layer, first sidewalls extending downward from the surface of the base layer, and a first bottom surface coupled between the first sidewalls;
a second trench in the base layer, wherein the second trench is defined by the first bottom surface, second sidewalls extending downward from the first bottom surface, and a second bottom surface coupled between the second sidewalls;
a silicon dioxide layer formed in the second trench;
a layer of nitride in direct contact with the base layer and covering at least the side walls of the first trench; and
a layer of oxidized polysilicon formed in the first trench.

20. An integrated circuit memory device, comprising:
an array of memory cells
a plurality of transistors coupled to the array of memory cells; and
an isolation region interposed between at least two devices, wherein the at least two devices are each selected from the group consisting or a memory cell of the array of memory cells and a transistor of the plurality of transistors, further wherein the isolation region comprises:
a base layer having a surface;
a first trench in the base layer, wherein the first trench is defined by the surface of the base layer, first sidewalls extending downward from the surface of the base layer, and a first bottom surface coupled between the first sidewalls;
a second trench in the base layer, wherein the second trench is defined by the first bottom surface, second sidewalls extending downward from the first bottom surface, and a second bottom surface coupled between the second sidewalls;
a first insulator formed on the first sidewalls comprising a layer of nitride in direct contact with the base layer;
a second insulator formed in the second trench; and
a third insulator formed in the first trench, wherein the third insulator comprises a material which is different from the second insulator.

21. The integrated circuit memory device of claim 20, wherein the first insulator is silicon nitride.

22. The integrated circuit memory device of claim 20, wherein the third insulator is oxidized polysilicon.

23. An integrated circuit memory device, comprising:
an array of memory cells
a plurality of transistors coupled to the array of memory cells; and
an isolation region interposed between at least two devices, wherein the at least two devices are each selected from the group consisting of a memory cell of the array of memory cells and a transistor of the plurality of transistors, further wherein the isolation region comprises:
a base layer having a surface;
a first trench in the base layer, wherein the first trench is defined by the surface of the base layer, first sidewalls extending downward from the surface of the base layer, and a first bottom surface coupled between the first sidewalls;
a second trench in the base layer, wherein the second trench is defined by the first bottom surface, second sidewalls extending downward from the first bottom surface, and a second bottom surface coupled between the second sidewalls;
a nitride layer formed on the first sidewalls in direct contact with the base layer;
a silicon dioxide layer formed in the second trench; and
a layer of oxidized polysilicon formed in the first trench.

24. An apparatus, comprising:
a processor; and
a memory device coupled to the processor, wherein the memory device comprises:
an array of memory cells
a plurality of transistors coupled to the array of memory cells; and
an isolation region interposed between at least two devices; wherein the at least two devices are each selected from the group consisting of a memory cell of the array of memory cells and a transistor of the plurality of transistors, further wherein the isolation region comprises:
a base layer having a surface;
a first trench in the base layer, wherein the first trench is defined by the surface of the base layer, first sidewalls extending downward from the surface of the base layer, and a first bottom surface coupled between the first sidewalls;
a second trench in the base layer, wherein the second trench is defined by the first bottom surface, second sidewalls extending downward from the first bottom surface, and a second bottom surface coupled between the second sidewalls;
a first insulator formed in the second trench; and
a second insulator formed in the first trench comprising a layer of nitride in direct contact with the base layer and covering at least the side walls of the first trench, wherein the first insulator comprises a material which is different from the second insulator.

25. The apparatus of claim 24, wherein the second insulator is oxidized polysilicon.

26. An apparatus, comprising:
a processor; and
a memory device coupled to the processor, wherein the memory device comprises:
an array of memory cells
a plurality of transistors coupled to the array of memory cells; and
an isolation region interposed between at least two devices, wherein the at least two devices are each selected from the group consisting of a memory cell of the array of memory cells and a transistor of the plurality of transistors, further wherein the isolation region comprises:

a base layer having a surface;
a first trench in the base layer, wherein the first trench is defined by the surface of the base layer, first sidewalls extending downward from the surface of the base layer, and a first bottom surface coupled between the first sidewalls;
a second trench in the base layer, wherein the second trench is defined by the first bottom surface, second sidewalls extending downward from the first bottom surface, and a second bottom surface coupled between the second sidewalls;
a silicon dioxide layer formed in the second trench;
a layer of nitride in direct contact with the base layer and covering at least the side walls of the first trench, and
a layer of oxidized polysilicon formed in the first trench.

27. An apparatus, comprising:
a processor; and
a memory device coupled to the processor, wherein the memory device comprises:
an array of memory cells
a plurality of transistors coupled to the array of memory cells; and
an isolation region interposed between at least two devices, wherein the at least two devices are each selected from the group consisting of a memory cell of the array of memory cells and a transistor of the plurality of transistors, further wherein the isolation region comprises:
a base layer having a surface;
a first trench in the base layer, wherein the first trench is defined by the surface of the base layer, first sidewalls extending downward from the surface of the base layer, and a first bottom surface coupled between the first sidewall;
a second trench in the base layer, wherein the second trench is defined by the first bottom surface, second sidewalls extending downward from the first bottom surface, and a second bottom surface coupled between the second sidewalls;
a first insulator formed on the first sidewalls comprising a layer of nitride in direct contact with the base layer;
a second insulator formed in the second trench; and
a third insulator formed in the first trench, wherein the third insulator differs from the second insulator.

28. The apparatus of claim 27, wherein the first insulator is silicon nitride.

29. The apparatus of claim 27, wherein the third insulator is oxidized polysilicon.

30. An apparatus, comprising:
a processor; and
a memory device coupled to the processor, wherein the memory device comprises:
an array of memory cells
a plurality of transistors coupled to the array of memory cells; and
an isolation region interposed between at least two devices, wherein the at least two devices are each selected from the group consisting of a memory cell of the array of memory cells and a transistor of the plurality of transistors, further wherein the isolation region comprises:
a base layer having a surface;
a first trench in the base layer, wherein the first trench is defined by the surface of the base layer, first sidewalls extending downward from the surface of the base layer, and a first bottom surface coupled between the first sidewalls;
a second trench in the base layer, wherein the second trench is defined by the first bottom surface, second sidewalls extending downward from the first bottom surface, and a second bottom surface coupled between the second sidewalls;
a nitride layer formed on the first sidewalls in direct contact with the base layer;
a silicon dioxide layer formed in the second trench; and
a layer of oxidized polysilicon formed in the first trench.

* * * * *

UNITED STATES PATENT AND TRADEMARK OFFICE
CERTIFICATE OF CORRECTION

PATENT NO.    : 6,365,952 B1
DATED         : April 2, 2002
INVENTOR(S)   : Akram It is certified that error appears in the above-identified patent and that said Letters Patent is hereby corrected as shown below:

<u>Title page,</u>
Item [56], References Cited, U.S. PATENT DOCUMENTS, delete "287" and insert -- 217 --, therefor.

<u>Column 1,</u>
Line 2, delete "Div of Ser. No." and insert -- Div. of U.S. Ser. No. --, therefor.
Line 38, delete "MOSFETS" and insert -- MOSFETs --, therefor.

<u>Column 6,</u>
Line 14, delete "of" and insert -- on --, therefor.
Line 35, delete "memory:" and insert -- memory; --, therefor.
Line 47, delete "memory system" and insert -- memory --, therefor.
Line 50, delete "all" and insert -- an --, therefor.

<u>Column 7,</u>
Line 9, after "cells" insert -- ; --.

<u>Column 8,</u>
Line 10, delete "sidewall" and insert -- sidewalls --, therefor.
Line 45, after "cells" insert -- ; --.
Line 65, delete "trench," and insert -- trench; --, therefor.

<u>Column 9,</u>
Line 7, after "cells" insert -- ; --.
Line 34, after "cells" insert -- ; --.
Line 65, after "cells" insert -- ; --.

<u>Column 10,</u>
Line 26, after "cells" insert -- ; --.
Line 30, delete "devices;" and insert -- devices, --, therefor.
Line 59, after "cells" insert -- ; --.

<u>Column 11,</u>
Line 22, after "cells" insert -- ; --.

UNITED STATES PATENT AND TRADEMARK OFFICE
CERTIFICATE OF CORRECTION

PATENT NO. : 6,365,952 B1
DATED : April 2, 2002
INVENTOR(S) : Akram

It is certified that error appears in the above-identified patent and that said Letters Patent is hereby corrected as shown below:

<u>Column 12,</u>
Line 16, after "cells" insert -- ; --.

Signed and Sealed this

Twenty-ninth Day of October, 2002

*Attest:*

*Attesting Officer*

JAMES E. ROGAN
*Director of the United States Patent and Trademark Office*